(12) United States Patent
Shin et al.

(10) Patent No.: US 11,043,273 B2
(45) Date of Patent: Jun. 22, 2021

(54) VERTICAL MEMORY DEVICE AND AN OPERATING METHOD THEREOF

(71) Applicant: SAMSUNG ELECTRONICS CO., LTD., Suwon-si (KR)

(72) Inventors: Chang-hwan Shin, Hwaseong-si (KR); Cheol Song, Hwaseong-si (KR); Chang-sub Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/581,917

(22) Filed: Sep. 25, 2019

(65) Prior Publication Data
US 2020/0273522 A1 Aug. 27, 2020

(30) Foreign Application Priority Data

Feb. 27, 2019 (KR) .................. 10-2019-0023285

(51) Int. Cl.
| G11C 16/04 | (2006.01) |
| G11C 16/10 | (2006.01) |
| G11C 11/56 | (2006.01) |
| G11C 16/14 | (2006.01) |

(52) U.S. Cl.
CPC .......... *G11C 16/10* (2013.01); *G11C 11/5628* (2013.01); *G11C 11/5635* (2013.01); *G11C 16/0483* (2013.01); *G11C 16/14* (2013.01)

(58) Field of Classification Search
CPC . G11C 16/10; G11C 11/5628; G11C 11/5635; G11C 16/0483; G11C 16/14
See application file for complete search history.

(56) References Cited

U.S. PATENT DOCUMENTS

| 7,974,130 | B2 | 7/2011 | Nakamura et al. |
| 8,379,456 | B2 | 2/2013 | Park et al. |
| 8,976,592 | B2 | 3/2015 | Park et al. |
| 9,013,923 | B2 | 4/2015 | Park |
| 9,214,237 | B2 * | 12/2015 | Shiino .................. G11C 16/28 |
| 9,685,235 | B2 | 6/2017 | Park et al. |
| 9,721,664 | B2 | 8/2017 | Nam et al. |
| 9,792,992 | B1 | 10/2017 | Park et al. |
| 9,916,900 | B2 * | 3/2018 | Kim .................... G11C 16/107 |
| 9,997,248 | B2 | 6/2018 | Lee |
| 2017/0117056 | A1 * | 4/2017 | Park ..................... G11C 16/10 |
| 2018/0059937 | A1 | 3/2018 | Kim |

FOREIGN PATENT DOCUMENTS

KR    10-2009-0124291    12/2009

* cited by examiner

*Primary Examiner* — Pho M Luu
(74) *Attorney, Agent, or Firm* — F. Chau & Associates, LLC

(57) ABSTRACT

An operating method of a memory device including a plurality of strings on a substrate, wherein the plurality of strings include a main string connected to a bit line and a dummy string spaced apart from the bit line, the operating method including: pre-programming the dummy string; and erasing the main string and the dummy string, wherein the pre-programming includes: applying a pre-program voltage to a word line connected to the dummy string; applying a pass voltage to a ground selection line connected to a ground selection transistor of the dummy string; and applying a common source line voltage to a common source line connected to the dummy string.

20 Claims, 16 Drawing Sheets

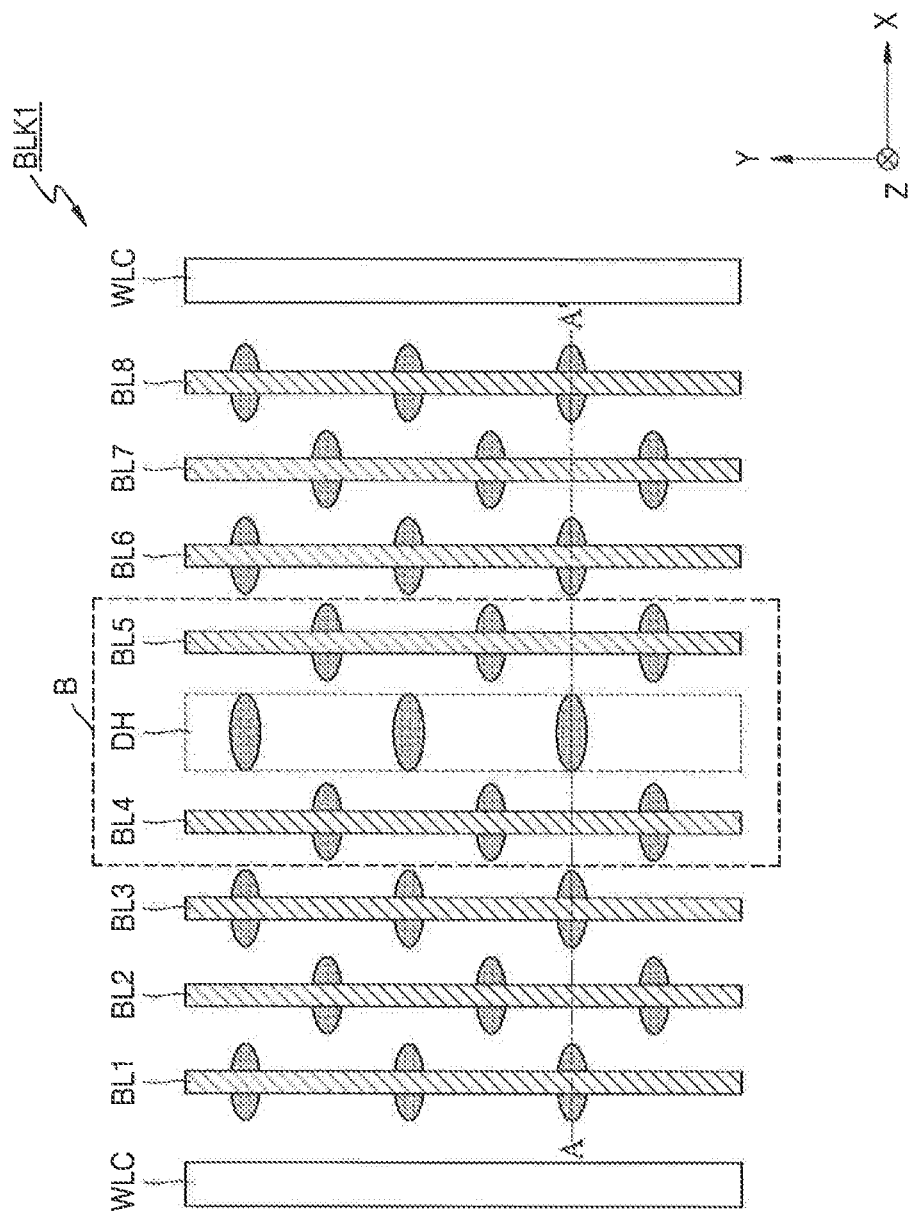

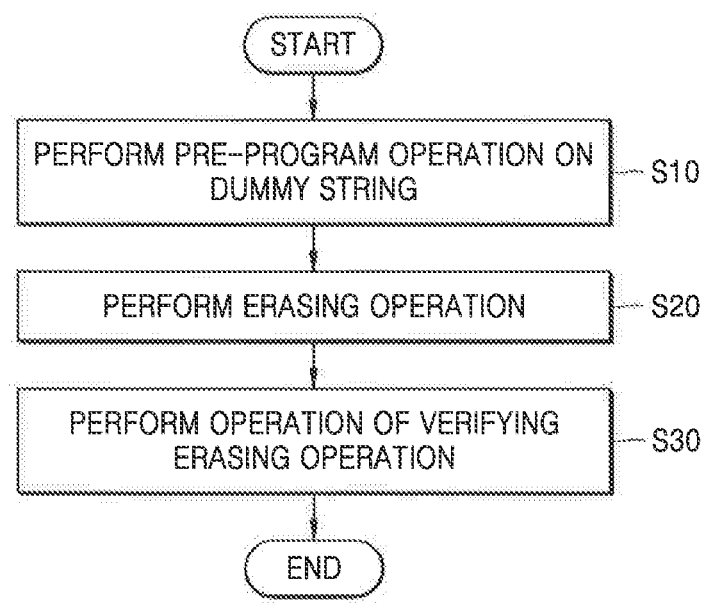

FIG. 10A

| | Pre-Program |
|---|---|
| WL | Vprepro |
| DWL1 | Vprepro |

FIG. 10B

| | Pre-Program |
|---|---|
| WL | Vwp |
| DWL1 | Vprepro |

FIG. 10C

| | Pre-Program |
|---|---|
| WL3~WL7 | Vwp |
| WL1~WL2 | Vprepro |
| DWL1 | Vprepro |

FIG. 12A

| | Pre-Program |
|---|---|
| BL | Vbpro |
| DBL | Vbpro |

FIG. 12B

| | Pre-Program |
|---|---|
| BL | Vbinh |
| DBL | Vbpro |

VERTICAL MEMORY DEVICE AND AN OPERATING METHOD THEREOF

CROSS-REFERENCE TO RELATED APPLICATION

This application claims priority under 35 U.S.C. § 119 to Korean Patent Application No. 10-2019-0023285, filed on Feb. 27, 2019, in the Korean Intellectual Property Office, the disclosure of which is incorporated by reference herein in its entirety.

TECHNICAL FIELD

The inventive concept relates to a vertical memory device and an operating method thereof.

DISCUSSION OF RELATED ART

In recent years, there has been a demand for memory devices that are highly integrated and that can store large amounts of data. Vertical memory devices, which include memory cells arranged vertically in three dimensions, have been developed to increase integration. Due to the increase in integration of a memory device, memory devices are scaled down, thereby causing the structures thereof to change. These structural changes have been found to damage the strings in memory devices and consequently damage data stored in the memory devices.

SUMMARY

According to an exemplary embodiment of the inventive concept, there is provided an operating method of a memory device including a plurality of strings on a substrate, wherein the plurality of strings include a main string connected to a bit line and a dummy string spaced apart from the bit line, the operating method including: pre-programming the dummy string; and erasing the main string and the dummy string, wherein the pre-programming includes: applying a pre-program voltage to a word line connected to the dummy string; applying a pass voltage to a ground selection line connected to a ground selection transistor of the dummy string; and applying a common source line voltage to a common source line connected to the dummy string.

According to another exemplary embodiment of the inventive concept, there is provided a memory device including: a memory cell array including a plurality of strings each including memory cells respectively connected to word lines vertically stacked on a substrate; and a control logic configured to sequentially perform a pre-program operation and an erasing operation on the plurality of strings, wherein the plurality of strings include a main string to which a bit line is connected and a dummy string spaced apart from the bit line, and the control logic, to perform the pre-program operation, applies a pre-program voltage to at least one of the word lines connected to the dummy string, applies a pass voltage to a ground selection line connected to a ground selection transistor of the dummy string, and applies a common source line voltage to a common source line connected to the dummy string.

According to another exemplary embodiment of the inventive concept, there is provided a memory device including: a memory cell array including a plurality of strings each including memory cells respectively connected to word lines vertically stacked on a substrate; and a control logic configured to perform a pre-program operation on the plurality of strings, wherein the plurality of strings include a main string to which a bit line is connected and a dummy string spaced apart from the bit line, the control logic, during a pre-program operation, applies a pre-program voltage to the word lines, applies a pass voltage to a ground selection line connected to a ground selection transistor of the dummy string, and applies a first common source line voltage to a common source line connected to the dummy string, and a time in which the pre-program voltage is applied to the word lines, a time in which the pass voltage is applied to the ground selection line, and a time in which the first common source line voltage is applied to the common source line overlap one another.

According to another exemplary embodiment of the inventive concept, there is provided an operating method of a memory device including a plurality of strings, wherein the plurality of strings include a first string connected to a first bit line of a plurality of bit lines and a second string not connected to the bit lines, the operating method including: applying a pre-program voltage to a word line connected to the second string; applying a pass voltage to a ground selection line connected to a ground selection transistor of the second string; and applying a common source line voltage to a common source line connected to the second string.

BRIEF DESCRIPTION OF THE DRAWINGS

The above and other features of the inventive concept will be more clearly understood by describing in detail exemplary embodiments thereof with reference to the accompanying drawings in which:

FIGS. 2A, 2B and 2C are views for explaining a first memory block illustrated in FIG. 1, according to an exemplary embodiment of the inventive concept;

FIG. 3A is a flowchart illustrating an operating method of a memory device, according to an exemplary embodiment of the inventive concept;

FIG. 3B is a table illustrating voltage conditions during a pre-program operation performed by a memory device according to an exemplary embodiment of the inventive concept;

FIGS. 10A, 10B and 10C are tables illustrating voltage conditions applied to word lines and dummy word lines when a memory device according to an exemplary embodiment of the inventive concept performs a pre-program operation;

FIGS. 12A and 12B are tables illustrating voltage conditions applied to bit lines and dummy bit lines when a memory device according to an exemplary embodiment of the inventive concept performs a pre-program operation.

DETAILED DESCRIPTION OF THE EMBODIMENTS

Figure 1:
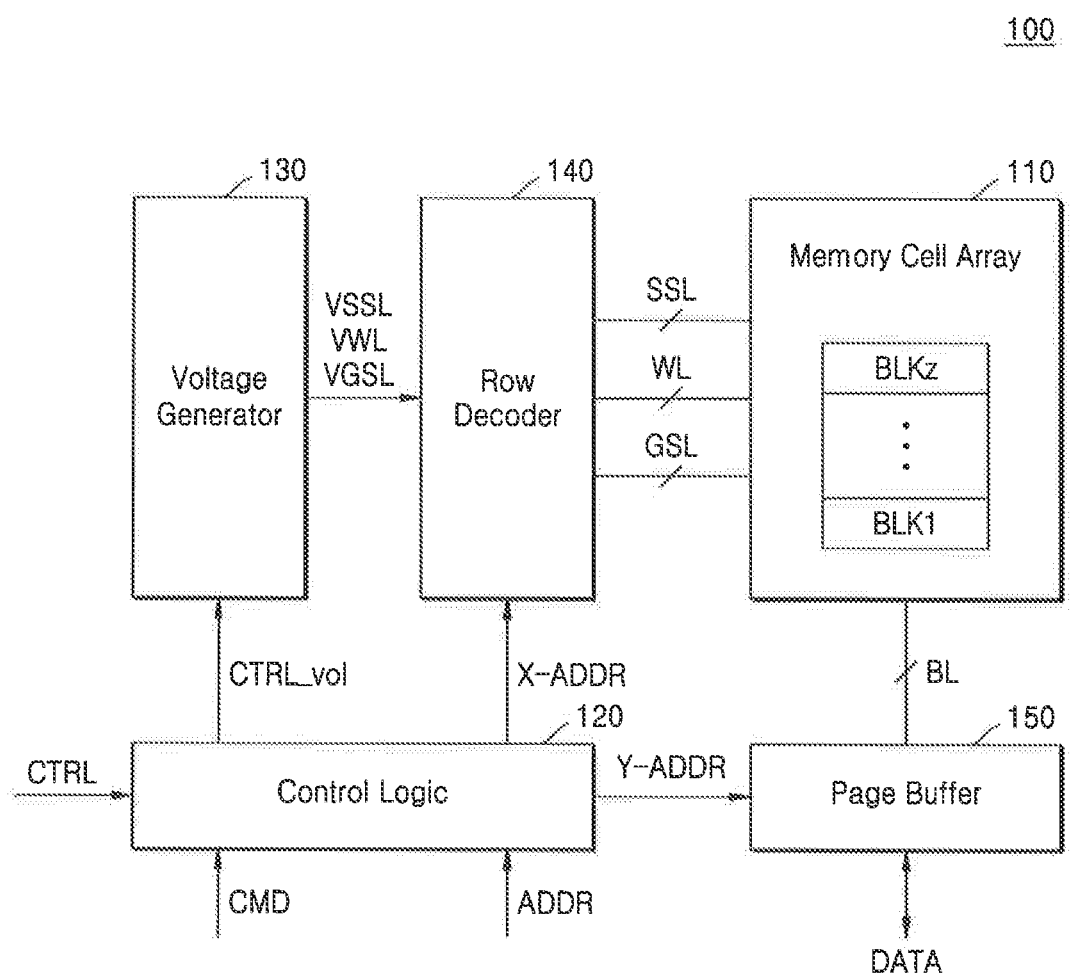
FIG. 1 is a block diagram illustrating a memory device according to an exemplary embodiment of the inventive concept.

Hereinafter, exemplary embodiments of the inventive concept will be described in detail with reference to the accompanying drawings. Like reference numerals may refer to like elements in the drawings.

FIG. 1 is a block diagram illustrating a memory device 100 according to an exemplary embodiment of the inventive concept.

Referring to FIG. 1, the memory device 100 may include a memory cell array 110, a control logic 120, a voltage generator 130, a row decoder 140, and a page buffer 150. The memory device 100 may further include various other components related to memory operations. For example, the memory device 100 may include a data input/output circuit and an input/output interface.

The memory cell array 110 includes a plurality of memory cells and may be connected to word lines WL, string selection lines SSL, ground selection lines GSL, common source lines, and bit lines BL. The memory cell array 110 may be connected to the row decoder 140 via the word lines WL, the string selection lines SSL, and the ground selection lines GSL, and may be connected to the page buffer 150 via the bit lines BL.

For example, the plurality of memory cells included in the memory cell array 110 may be non-volatile memory cells that retain stored data even when their power supply is interrupted. In exemplary embodiments of the inventive concept, when a memory cell is a non-volatile memory cell, the memory device 100 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like. Hereinafter, exemplary embodiments of the inventive concept in which a plurality of memory cells are NAND flash memory cells will be described. However, the inventive concept is not limited thereto.

The memory cell array 110 may include a plurality of memory blocks BLK1 to BLKz. For example, each of the memory blocks BLK1 to BLKz may have a three-dimensional structure (or vertical structure). In exemplary embodiments of the inventive concept, each of the memory blocks BLK1 to BLKz may include structures extending in first, second and third directions. For example, each of the memory blocks BLK1 to BLKz may include a plurality of NAND strings (hereinafter, referred to as 'strings') extending in the third direction. A plurality of strings may be spaced apart by certain distances in the first and second directions. A plurality of strings may include a cell string including main cells in which data is stored and a dummy string including dummy cells.

The memory blocks BLK1 to BLKz may be selected by the row decoder 140. For example, the row decoder 140 may select a memory block corresponding to a block address from among the memory blocks BLK1 to BLKz. In an exemplary embodiment of the inventive concept, in a unit of each of the memory blocks BLK1 to BLKz, an erasing operation may be performed, and a pre-program operation corresponding to the erasing operation may be performed. However, the inventive concept is not limited thereto. In exemplary embodiments of the inventive concept, in a unit of sub-memory blocks included in a single memory block, an erasing operation may be performed and a pre-program operation corresponding to the erasing operation may be performed.

Each memory cell included in the memory cell array 110 may be a multi level cell (MLC) that stores two or more bits of data. For example, the memory cell may be an MLC that stores 2-bit data. In exemplary embodiments of the inventive concept, the memory cell may be a triple level cell (TLC) that stores 3-bit data. However, the inventive concept is not limited thereto. In an exemplary embodiment of the inventive concept, some memory cells included in the memory cell array 110 may be single level cells (SLCs) that store 1-bit data and other memory cells included the memory cell array 110 may be MLCs.

The memory blocks BLK1 to BLKz may include a SLC block including SLCs, a MLC block including MLCs, or a TLC block including TLCs. From among a plurality of memory blocks included in the memory cell array 110, some memory blocks may be SLC blocks and other memory blocks may be MLC blocks or TLC blocks.

When an erasing voltage is applied to the memory cell array 110, a plurality of memory cells may be in an erased state. When a program voltage is applied to the memory cell array 110, a plurality of memory cells may be in a program state. For example, when a pre-program voltage is applied to the memory cell array 110, a plurality of memory cells may be in a pre-programmed state. In this case, each memory cell may have an erased state E and at least one program state, which are identified according to a threshold voltage ($V_{th}$).

The control logic 120 may output various control signals for programming data into the memory cell array 110 or reading data from the memory cell array 110, based on a command CMD, an address ADDR, and a control signal CTRL transmitted by a memory controller. For example, the control logic 120 may output a voltage control signal CTRL_vol for controlling the level of various voltages generated by the voltage generator 130. The control logic 120 may provide a row address X-ADDR to the row decoder 140 and a column address Y-ADDR to the page buffer 150.

The voltage generator 130 may generate various voltages used in the memory device 100 and may generate, for example, a word line voltage VWL, a string selection line voltage VSSL, and a ground selection line voltage VGSL. In exemplary embodiments of the inventive concept, the voltage generator 130 may generate a common source line voltage and a substrate voltage that is to be applied to a substrate on which the memory cell array 110 is formed. In exemplary embodiment of the inventive concept, the word line voltage VWL may include a pre-program voltage (for example, Vprepro illustrated in FIG. 3B) and the ground selection line voltage VGSL may include a pass voltage (e.g., Vpass illustrated in FIG. 3B).

The row decoder 140 may select at least one of the word lines of the selected memory block in response to the row address X-ADDR. In exemplary embodiments of the inventive concept, during a pre-program operation, the row decoder 140 may, in response to the row address X-ADDR, apply a pre-program voltage Vprepro as a word line voltage VWL to at least one word line of the word lines WL. During the pre-program operation, the row decoder 140 may apply a pass voltage Vpass as a ground selection line voltage VGSL to at least one of the ground selection lines GSL.

In exemplary embodiment of the inventive concept, the memory cell array 110 may be connected to a dummy word line and the row decoder 140 may, during a pre-program operation, selectively apply a pre-program voltage Vprepro to the dummy word line. In an exemplary embodiment of the inventive concept, during a pre-program operation, the row decoder 140 may provide the pre-program voltage Vprepro as a word line voltage VWL to the word line (e.g., the dummy word line) of the selected memory cell in response to the row address X-ADDR, and may provide the word line pass voltage as a word line voltage VWL to the word line of the unselected memory cell.

In an exemplary embodiment of the inventive concept, the magnitude of the pre-program voltage Vprepro may differ from the magnitude of the program voltage applied to word lines WL to write data to the memory cells. For example, the pre-program voltage Vprepro may have a level lower than the program voltage. In an exemplary embodiment of the inventive concept, the memory device 100 may apply a plurality of program pulses to word lines WL during a program operation to write data to the memory cells and may apply a pre-program voltage Vprepro having a single pulse to word lines WL during a pre-program operation.

The page buffer 150 may operate as a write driver or a sense amplifier. In an exemplary embodiment of the inventive concept, during a pre-program operation, the page buffer 150 acts as a write driver and applies a bit line program voltage to at least one bit line of bit lines BL.

The control logic 120 may control the voltage generator 130 and the row decoder 140 to perform a pre-program operation and an erasing operation. For example, when a pre-program operation is performed with respect to a dummy string, the control logic 120 may control the voltage generator 130 and the row decoder 140 to apply a pass voltage Vpass to a ground selection line connected to the dummy string. In an exemplary embodiment of the inventive concept, the control logic 120 may control a ground voltage to be applied to a common source line connected to a memory block in which a pre-program operation is performed.

During a pre-program operation, the memory device 100 may perform a pre-program operation on a dummy string by applying a ground voltage to a common source line, a pass voltage Vpass to a ground selection line, and a pre-program voltage Vprepro to a word line. The memory device 100 may pre-program the dummy cells in the dummy string even when the dummy string is not connected to the bit line. During the pre-program operation, the threshold voltage distribution of the dummy cells included in the dummy string may be shifted in a direction in which the threshold voltage is increased. The pre-program operation with respect to the dummy string is performed before or after the erasing operation, thereby preventing the dummy cells included in the dummy string from being damaged due to the repeated erasing operation.

Figure 2B:
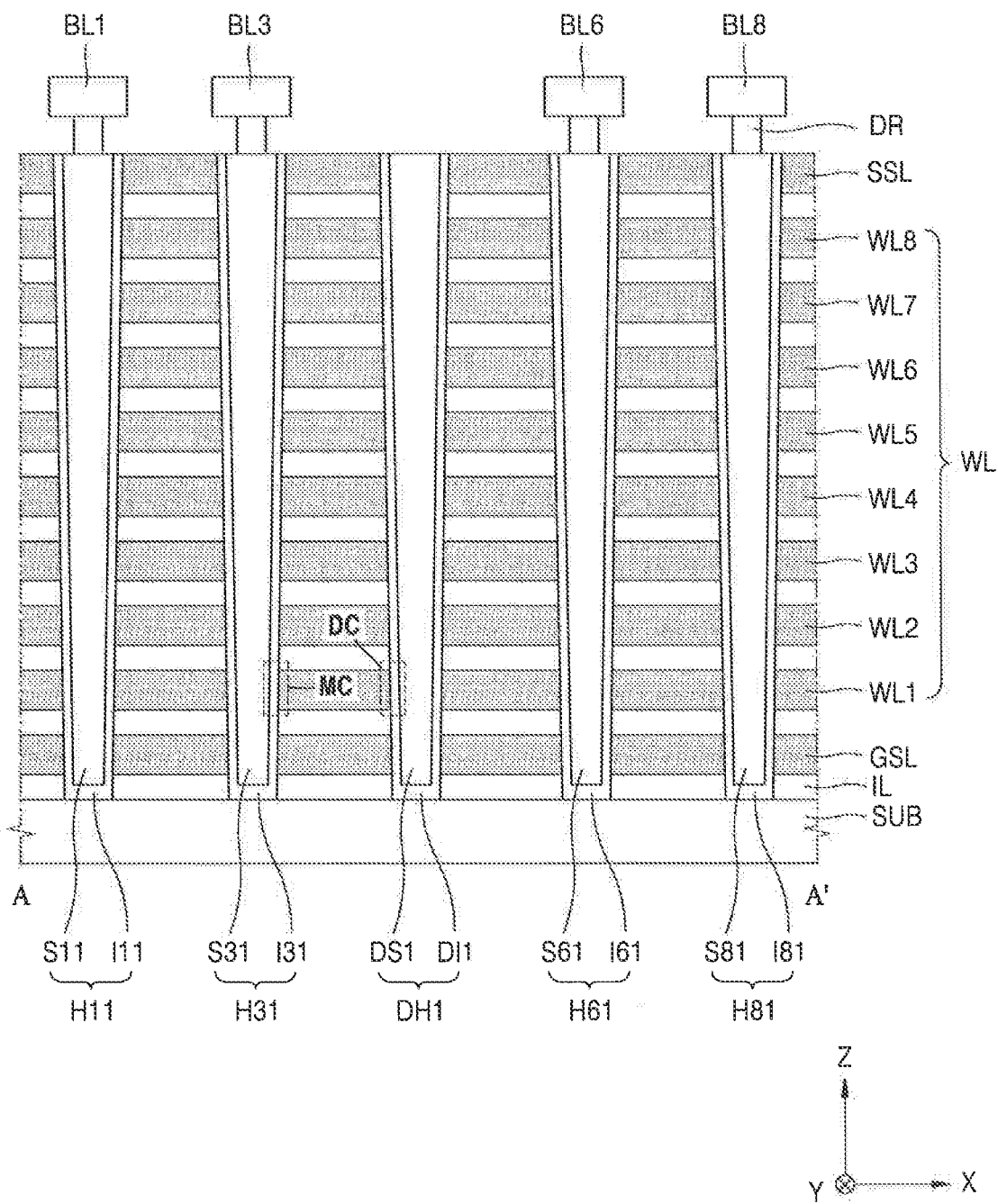
Figure 2C:
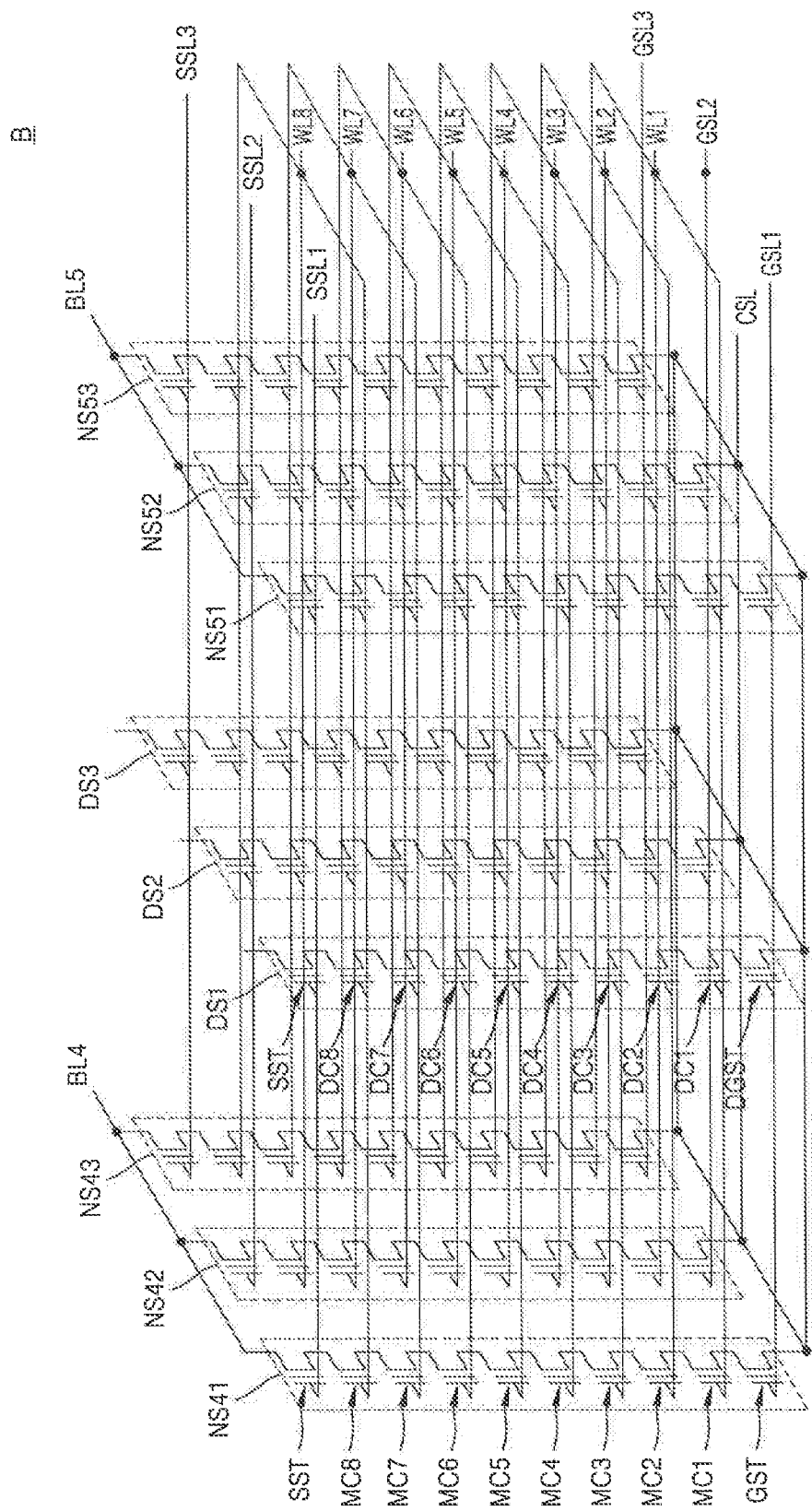

FIGS. 2A to 2C are views for explaining a first memory block illustrated in FIG. 1, according to an exemplary embodiment of the inventive concept. FIG. 2A is a top view of the first memory block illustrated in FIG. 1. FIG. 2B illustrates a cross-section taken along the line A-A' illustrated in FIG. 2A. FIG. 2C is a circuit diagram showing an equivalent circuit of region B of the memory block of FIG. 2A. The memory block BLK1 may be a vertical NAND flash memory, and each of the memory blocks BLK1 to BLKz illustrated in FIG. 1 may be implemented as shown in FIGS. 2A to 2C.

Referring to FIG. 2A, the memory block BLK1 may include word line cut regions WLC that are spaced apart from each other in a first direction X and that extend in a second direction Y. In addition, the memory block BLK1 may include a plurality of vertical holes (for example, main holes H11, H31, H61, and H81 and a dummy hole DH1 in FIG. 2B) arranged in the first and second directions Y between the word line cut regions WLC. The vertical holes may include main holes (for example, H11, H31, H61, and H81 in FIG. 2B) in which a main cell, in which data is stored, is formed, and dummy holes DH constituting a dummy cell in which data is not stored. The number of vertical holes included in the memory block BLK1 may vary. In FIGS. 2A to 2C, the dummy holes DI are shown as being arranged in the central region of the memory block BLK1, but the inventive concept is not limited thereto, and the arrangement of the dummy holes DH may vary. For example, the dummy holes DH may be arranged to the left or the right of the central region of the memory block BLK1.

The memory block BLK1 may be connected to bit lines BL1, BL2, BL3, BL4, BL5, BL6, BL7 and BL8 extending in the second direction Y and spaced apart from each other in the first direction X. In FIG. 2A, the memory block BLK1 is connected to eight bit lines, for example, the bit lines BL1 to BL8. However, the inventive concept is not limited thereto, and the number of bit lines may vary.

In an exemplary embodiment of the inventive concept, the main holes may be respectively connected to corresponding bit lines, and the dummy holes DH may be electrically spaced away from the bit lines BL1 to BL8. For example, the vertical holes connected to the first bit line BL are main holes, and main cells formed in the main holes may perform a data storage function. On the other hand, the dummy holes DH are vertical holes that are not connected to the bit lines BL1 to BL8, and memory cells formed in the dummy holes DH, in other words, dummy cells, may not perform the data storage function.

Referring to FIG. 2B, a ground selection line GSL, a plurality of word lines WL1, WL2, WL3, WL4, WL5, WL6, WL7 and WL8, and a string selection line SSL may be arranged on a substrate SUB. Insulating films IL may be sequentially provided among the substrate SUB, the ground selection line GSL, the word lines WL1 to WL8, and the string selection line SSL. The main holes H11, H31, H61, and H81 and the dummy hole DH1 may extend through the insulating films IL, the ground selection line GSL, the word lines WL1 to WL8, and the string selection line SSL, in the third direction Z. In FIG. 2B, eight word lines (for example, the word lines WL1 to WL8) are shown, but the inventive concept is not limited thereto and the number of word lines may vary. For example, surface layers I11, I13, I61, and I81 of the main holes H11, H31, H61, and H81 and a surface layer DI1 of the dummy hole DH1 may include a first-type silicon material and act as a channel region. The surface layers I11, I13, I61, I81, and DI1 may include p-type silicon. However, the surface layers I11, I13, I61, I81, and DI1 may not be limited to include the p-type silicon. For example, the surface layers I11, I13, I61, I81, and DI1 may include an intrinsic semiconductor being a nonconductor. Internal layers S11, S13, S61, and S81 of the main holes H11, H31, H61, and H81, and an internal layer DS1 of the dummy hole DH1 may include an insulating material such as a silicon oxide or an air gap.

Each of the main holes HI 1, H31, H61, and H81 and each of the plurality of word lines WL to WL8 may form a main cell MC. For example, the main hole H31 and the word line WL1 may form the main cell MC. In exemplary embodiments of the inventive concept, the dummy hole DH1 and each of the plurality of word lines WL1 to WL8 may form the dummy cells DC. For example, the dummy hole DH1 and the word line WL1 may form the dummy cell DC.

Since the dummy cells DC formed in the dummy holes DH1 are not connected to the bit lines BL1, BL3, BL6 and BL8, the dummy cells DC may not be programmed when a voltage is applied to the bit lines BL1, BL3, BL6, and BL8. Accordingly, in a memory device according to an exemplary embodiment of the inventive concept, the dummy cells DC formed in the dummy hole DH1 may be pre-programmed by applying a ground voltage to a common source line formed on the substrate SUB, a pass voltage to the ground selection line GSL, and a pre-program voltage to the word lines WL1 to WL8. In an exemplary embodiment of the inventive concept, a memory device may pre-program at least some of the dummy cells DC formed in the dummy hole DH1 by selectively applying a pre-program voltage to at least some of the word lines WL1 to WL8.

Due to the applying of the ground voltage to the common source line, the pass voltage to the ground selection line GSL, and the pre-program voltage to the word lines WL1 to WL8, the main cells MC may also be pre-programmed together with the dummy cells DC.

Referring to FIGS. 2A and 2C, the memory block BLK1 may include a plurality of cell strings NS41, NS42 and NS43 and NS51, NS52 and NS53, a plurality of dummy strings DS1, DS2 and DS3, a plurality of word lines WL1 to WL8, a plurality of bit lines BL4 and BL5, a plurality of ground selection lines GSL1, GSL2 and GSL3, a plurality of string selection lines SSL1, SSL2 and SSL3, and a common source line CSL. The number of cell strings, the number of word lines, the number of bit lines, the number of ground selection lines, and the number of string selection lines in the memory block BLK1 may vary according to an exemplary embodiment of the inventive concept.

The cell strings NS41, NS42, and NS43 are provided between the bit line BL4 and the common source line CSL, and the cell strings NS51, NS52, and NS53 may be provided between the bit line BL5 and the common source line CSL. The dummy strings DS1, DS2, and DS3 may be connected to the common source line CSL, but not to bit lines.

Each of the cell strings NS41 to NS43 and NS51 to NS53 may include a string selection transistor SST, a plurality of main cells MC1, MC2, MC3, MC4, MC5, MC6, MC7 and MC8, and a ground selection transistor GST, which are connected in series.

Cell strings commonly connected to a single bit line may constitute one column. For example, the cell strings NS41, NS42 and NS43 commonly connected to the bit line BL4 may correspond to a single column and the cell strings NS51, NS52, and NS53 commonly connected to the bit line BL5 may correspond to another column.

Cell strings and dummy strings connected to a single string selection line may constitute one row. For example, the cell strings NS41 and NS51 and the dummy string DS1 connected to the string selection line SSL1 may correspond to a first row, the cell strings NS42 and NS52 and the dummy string DS2 connected to the string selection line SSL2 may correspond to a second row, and the cell strings NS43 and NS53 and the dummy string DS3 connected to the third string selection line SSL3 may correspond to a third row. In FIG. 2C, the string selection lines SSL1 to SSL3 are shown as being different lines, but the inventive concept is not limited thereto. The string selection lines SSL1 to SSL3 may be connected to each other to form one string selection line.

The string selection transistor SST may be connected to a corresponding string selection line selected from the string selection lines SSL1 to SSL3. The main cells MC1 to MC8 may be connected to the word lines WL1 to WL8, respectively, and the dummy cells DC1, DC2, DC3, DC4, DC5, DC6, DC7 and DC8 may be connected to the word lines WL1 to WL8, respectively.

The ground selection transistors GST may be connected to corresponding ground selection lines selected from the ground selection lines GSL1 to GSL3, and the string selection transistors SST may be connected to a corresponding bit line selected from the bit lines BL1 to BL3. The ground selection transistor GST may be connected to the common source line CSL. In FIG. 2C, the ground selection lines GSL1 to GSL3 are shown as being different lines, but the inventive concept is not limited thereto. The ground selection lines GSL1 to GSL3 may be connected to each other to form a single ground selection line. The dummy strings DS1, DS2 and DS3 may each be connected to a dummy ground selection transistor DGST.

FIG. 3A is a flowchart illustrating an operating method of a memory device, according to an exemplary embodiment of the inventive concept. FIG. 3B is a table illustrating voltage conditions during a pre-program operation performed by a memory device according to an exemplary embodiment of the inventive concept.

Referring to FIG. 3A, in operation S10, a memory device (for example, 100 in FIG. 1) may perform a pre-program operation on a dummy string (S10). For example, the memory device 100 may perform a pre-program operation on a dummy string included in a memory block (for example, BLK1 in FIG. 1) of a plurality of memory blocks (for example, BLK1 to BLKz in FIG. 1). During the pre-program operation, the threshold voltage distribution of the dummy cells included in the dummy string may be shifted in a direction in which the threshold voltage is increased.

In an exemplary embodiment of the inventive concept, when the dummy cells of the dummy string included in the memory block BLK1 are pre-programmed, the main cells of the main string included in the memory block BLK1 may also be pre-programmed. In exemplary embodiments of the inventive concept, only the dummy cells of the dummy string included in the memory block BLK1 are pre-programmed, and the main cells of the main string included in the memory block BLK1 may not be pre-programmed. The operation of selectively pre-programming dummy cells of a dummy string will be described later with reference to FIG. 12B.

Referring to FIGS. 3A and 3B, to perform a pre-program operation, a memory device may apply a pre-program voltage Vprepro to word lines WL. For example, the memory device 100 may apply a pre-program voltage Vprepro to word lines WL connected to the dummy string on which the pre-program operation is to be performed.

The memory device 100 may apply a pass voltage Vpass to the ground selection line GSL connected to the dummy string and apply a first common source line voltage (for example, ground voltage Vss) to the common source line CSL. The pass voltage Vpass may be a voltage for turning on a ground selection transistor (for example, GST in FIG. 2C). Accordingly, since the pass voltage Vpass is applied to the ground selection line GSL, the ground selection transistor GST is turned on and a ground voltage Vss may be applied to a source of a dummy cell. Although the bit line voltage is not applied to a dummy string because a bit line is not connected to the dummy string, since the ground voltage Vss is applied to the common source line CSL and the pass voltage Vpass is applied to the ground selection line GSL, the dummy cells included in the dummy string may be pre-programmed. In this regard, a ground voltage may be applied to a substrate (for example, SUB in FIG. 2B). However, the inventive concept is not limited thereto. For example, the memory device 100 may apply a pass voltage Vpass to the ground selection line GSL connected to a dummy string and apply a voltage that is not a ground voltage (for example, a second common source line voltage) to the common source line CSL.

Referring to FIG. 3A, in operation S20, the memory device 100 may perform an erasing operation on a plurality of memory cells including a dummy string on which a pre-program has been performed. For example, the memory device 100 may perform an erasing operation on the memory block BLK1 of the memory blocks BLK1 to BLKz, and the data stored in the main cells of the cell strings included in the memory block BLK1 may be erased. In exemplary embodiments of the inventive concept, for example, the memory device 100 may perform an erasing operation on a portion of the memory block BLK1, and the data stored in the main cells of the cell strings included in the portion of the memory block BLK1 may be erased.

In operation S30, the memory device 100 may perform an operation of verifying the erasing operation. In an exemplary embodiment of the inventive concept, the memory device 100 may perform the verifying operation for the main cells included in the memory block BLK1 on which operation S10 and operation S20 have been performed. For example, it is verified whether the threshold voltage distribution of the main cells included in the memory block BLK1 on which operation S10 and operation S20 have been performed has shifted to an erasing verification voltage or less. In an exemplary embodiment of the inventive concept, the memory device 100 may perform the verifying operation for the main cells included in the portion of the memory block BLK1 on which operation S10 and operation S20 have been performed. When the memory device 100 determines that the erasing is not completed, the memory device 100 may perform operation S30 again. After operation S30, the memory device 100 may further perform a program operation for programming, with new data, main cells of which data have been erased.

In exemplary embodiments of the inventive concept, the memory device 100 may perform operation S20 after operation S10. In exemplary embodiments of the inventive concept, the memory device 100 may perform operation S10 after sequentially performing operation S20 and operation S30. When operation S10 is performed after operation S30, in operation S10, only dummy cells of a dummy string are pre-programmed and main cells of a main string may not be pre-programmed. When operation S10 is performed after operation S30, the memory device 100 may further perform a program operation for programming, with new data, main cells of which data has been erased, after operation S10.

Exemplary embodiments of the inventive concept have been described in which operation S10 and operation S20 are performed in units of memory blocks. However, in exemplary embodiments of the inventive concept, operation S10 and operation S20 may be performed in units of sub-memory blocks constituting a portion of a memory block. For example, the memory device 100 may perform a pre-program operation on a dummy string included in a portion (e.g., a sub-memory block) of the memory block BLK1, and in this case, main cells of the main string included in the portion (e.g., the sub-memory block) of the first memory block BLK1 may also be pre-programmed. In exemplary embodiments of the inventive concept, the memory device 100 may perform an erasing operation on the portion (e.g., the sub-memory block) of the memory block BLK1.

The memory device 100 according to an exemplary embodiment of the inventive concept may perform the pre-program operation (S10) on a dummy string before or after the erasing operation (S20), thereby preventing the dummy string from being damaged due to the repeating of the erasing operation on the dummy cells included in the dummy string.

FIGS. 4 to 8 are timing diagrams of voltages applied to each line during a pre-program operation and an erasing operation performed by a memory device according to an exemplary embodiment of the inventive concept. FIGS. 4 to 8 are timing diagrams for explaining operation S10 and operation S20 of FIG. 3A.

Figure 4:
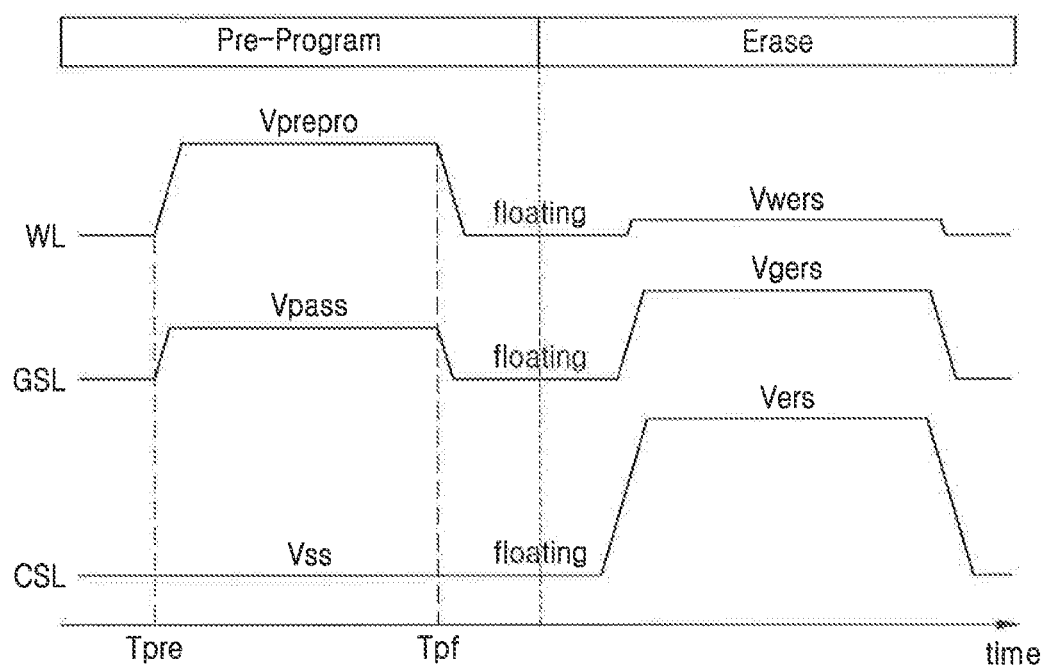
FIGS. 4, 5, 6, 7 and 8 are timing diagrams of voltages applied to each line during a pre-program operation and an erasing operation performed by a memory device according to an exemplary embodiment of the inventive concept.

Referring to FIG. 4, in a pre-program operation, a memory device (for example, the memory device 100 in FIG. 1) may apply a pre-program voltage Vprepro to word lines WL connected to a dummy string in which the pre-program operation is to be performed, a pass voltage Vpass to a ground selection line GSL connected to the dummy string, and a first common source line voltage (for example, the ground voltage Vss) to the common source line CSL. When the memory device 100 performs a pre-program operation, a substrate (for example, the SUB of FIG. 3) may maintain the ground voltage Vss.

A section in which the pre-program voltage Vprepro is applied to the word lines WL and a section in which the pass voltage Vpass is applied to the ground selection line GSL may overlap. For example, at a time point Tpre in which the pre-program voltage Vprepro is applied to the word lines WL, the pass voltage Vpass may be applied to the ground selection line GSL. In exemplary embodiments of the inventive concept, at a time point Tpf at which the word lines WL float at the pre-program voltage Vprepro, the ground selection line GSL may float at the pass voltage Vpass. In an exemplary embodiment of the inventive concept, the section in which the pre-program voltage Vprepro is applied to the word lines WL may match with the section in which the pass voltage Vpass is applied to the ground selection line GSL. For example, the pre-program voltage Vprepro and the pass voltage Vpass may be applied at the same time.

In exemplary embodiments of the inventive concept, the section in which the pre-program voltage Vprepro is applied to the word lines WL and the section in which the first common source line voltage (for example, the ground voltage Vss) is applied to the common source line CSL may overlap. For example, at the time point Tpre in which the pre-program voltage Vprepro is applied to the word lines WL, the ground voltage Vss may be applied to the common source line CSL. In exemplary embodiments of the inventive concept, at the time point Tpf at which the word lines WL float at the pre-program voltage Vprepro, the common source line CSL may float at the ground voltage Vss. In an exemplary embodiment of the inventive concept, the section in which the pre-program voltage Vprepro is applied to the word lines WL may match with the section in which the ground voltage Vss is applied to the common source line CSL. For example, the pre-program voltage Vprepro and the ground voltage Vss may be applied at the same time.

During an erasing operation, the memory device 100 may apply a word line erasing voltage Vwers to the word lines WL, may apply a ground erasing voltage Vgers to the ground selection line GSL, and may apply an erasing voltage Vers to the common source line CSL. In this case, the word line erasing voltage Vwers may be the ground voltage Vss or may have a level close to the ground voltage Vss. The intensity of the ground erasing voltage Vgers may be lower than that of the erasing voltage Vers by a certain level. For example, the memory device 100 may, depending on the level of the erasing voltage Vers applied to the common source line CSL, apply the ground erasing voltage Vgers to the ground selection line GSL. During the erasing operation performed by the memory device 100, the erasing voltage Vers may be applied to the substrate SUB.

Figure 5:
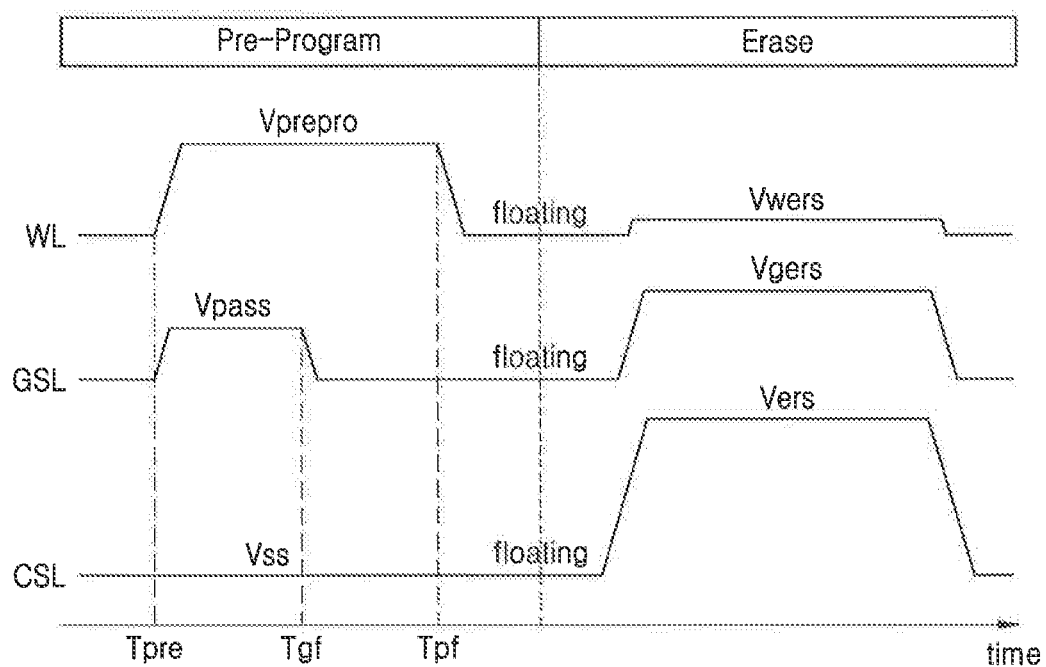

Referring to FIG. 5, the section in which the pre-program voltage Vprepro is applied to the word lines WL and the section in which the pass voltage Vpass is applied to the ground selection line GSL may overlap. In an exemplary embodiment of the inventive concept, the time point Tgf at which the ground selection line GSL floats at the pass voltage Vpass may differ from a time point Tpf at which the word lines WL float at the pre-program voltage Vprepro. For example, the time point Tgf at which the ground selection line GSL floats at the pass voltage Vpass may occur before the time point Tpf at which the word lines WL float at the pre-program voltage Vprepro. Accordingly, the section in which the pass voltage Vpass is applied to the ground selection line GSL may be shorter than the section in which the pre-program voltage Vprepro is applied to the word lines WL. In other words, the pass voltage Vpass may be applied for a shorter amount of time than the pre-program voltage Vprepro. However, in exemplary embodiments of the inventive concept, the section in which the pass voltage Vpass is applied to the ground selection line GSL may be longer than the section in which the pre-program voltage Vprepro is applied to the word lines WL. In other words, the pass voltage Vpass may be applied for a longer amount of time than the pre-program voltage Vprepro.

Figure 6:
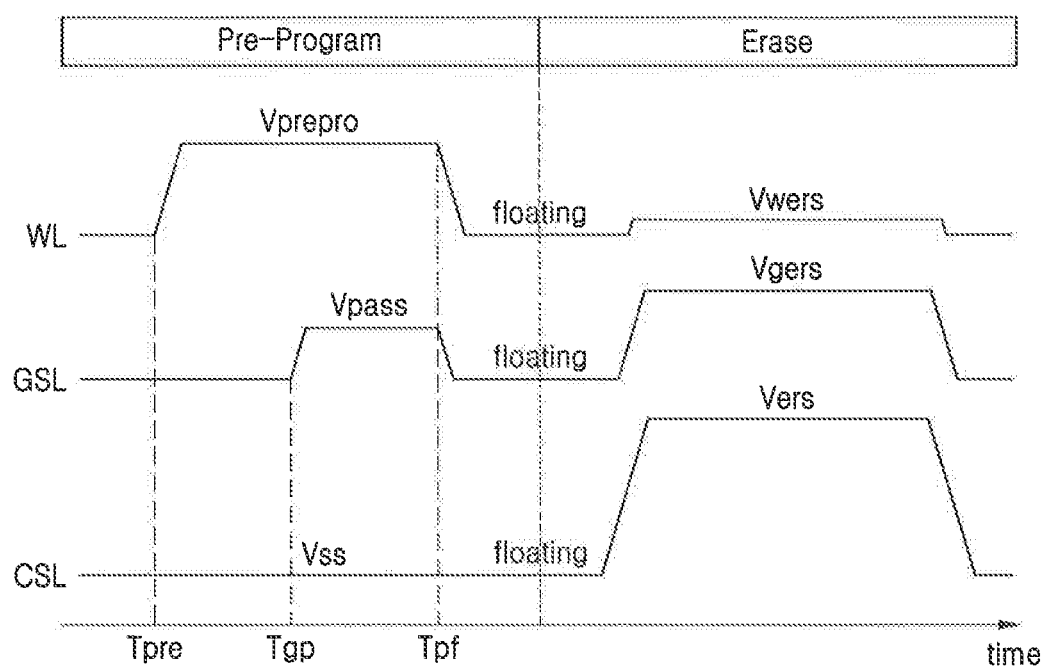

Referring to FIG. 6, the section in which the pre-program voltage Vprepro is applied to the word lines WL and the section in which the pass voltage Vpass is applied to the ground selection line GSL, may overlap. In an exemplary embodiment of the inventive concept, the time point Tpre at which the pre-program voltage Vprepro is applied to the word lines WL may differ from a time point Tgp at which the pass voltage Vpass is applied to the ground selection line GSL. For example, the time point Tpre at which the pre-program voltage Vprepro is applied to word lines the WL may occur before the time point Tgp at which the pass voltage Vpass is applied to the ground selection line GSL. Accordingly, the section in which the pass voltage Vpass is applied to the ground selection line GSL may be shorter than the section in which the pre-program voltage Vprepro is applied to the word lines WL. However, in exemplary embodiments of the inventive concept, the section in which the pass voltage Vpass is applied to the ground selection line GSL may be longer than the section in which the pre-program voltage Vprepro is applied to the word lines WL.

Figure 7:
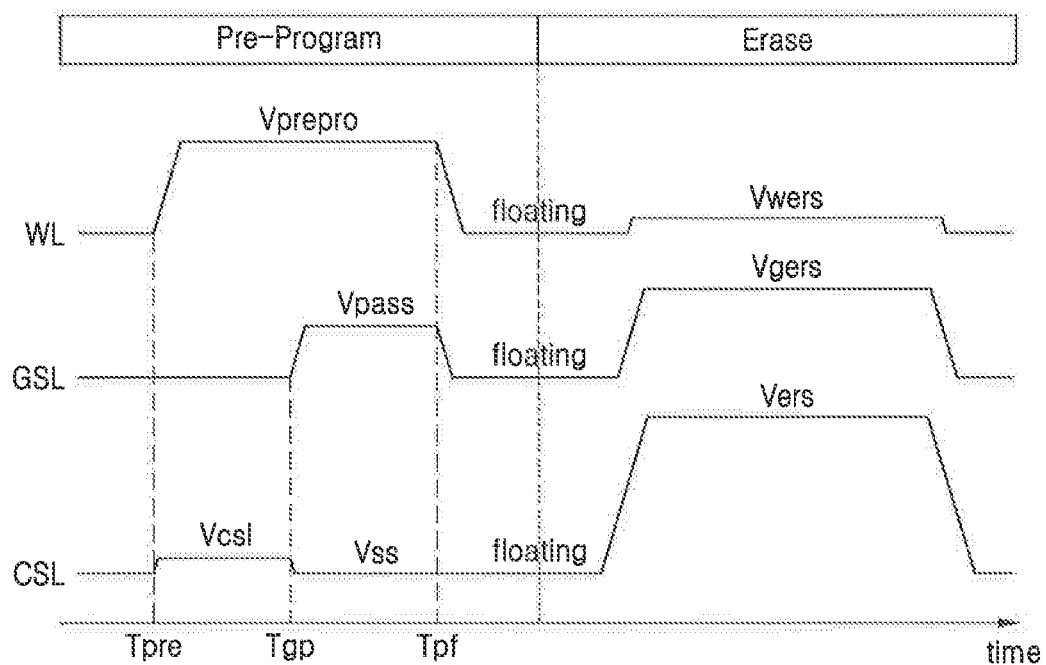

Referring to FIG. 7, the section in which the pre-program voltage Vprepro is applied to the word lines WL and the section in which the first common source line voltage (for example, the ground voltage Vss) is applied to the common source line CSL may overlap. In an exemplary embodiment of the inventive concept, the time point Tpre in which the pre-program voltage Vprepro is applied to the word lines WL may differ from a time point Tgp at which the ground voltage Vss is applied to the common source line CSL. For example, after the time point Tpre at which the pre-program voltage Vprepro is applied to the word lines WL, the ground voltage Vss may be applied to the common source line CSL, and at the time point Tgp at which the pass voltage Vpass is applied to the ground selection line GSL, the ground voltage Vss may be applied to the common source line CSL.

In an exemplary embodiment of the inventive concept, the section in which the ground voltage Vss is applied to the common source line CSL may be shorter than the section in which the pre-program voltage Vprepro is applied to word lines WL. In other words, the ground voltage Vss may be applied for a shorter amount of time than the pre-program voltage Vprepro. In an exemplary embodiment of the inventive concept, the section in which the ground voltage Vss is applied to the common source line CSL and the section in which the pass voltage Vpass is applied to the ground selection line GSL may overlap, for example, may match with each other. For example, the ground voltage Vss and the pass voltage Vpass may be applied for the same amount of time. In an exemplary embodiment of the inventive concept, however, the section in which the ground voltage Vss is applied to the common source line CSL may be longer than the section in which the pre-program voltage Vprepro is applied to the word lines WL.

In an exemplary embodiment of the inventive concept, before the ground voltage Vss is applied to the common source line CSL, a second common source line voltage Vcs1 may be applied to the common source line CSL. When a ground selection transistor connected to the ground selection line GSL is turned off, the application of the second common source line voltage Vcs1 to the common source line CSL may prevent any damage to the common source line CSL due to the pre-program operation.

Figure 8:
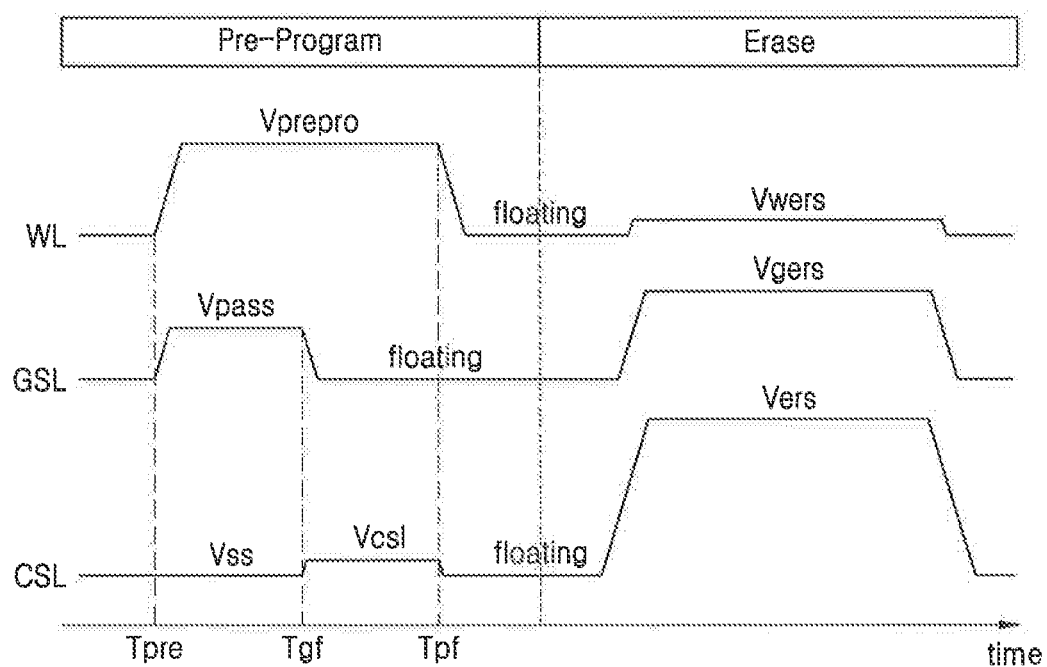

Referring to FIG. 8, the section in which the pre-program voltage Vprepro is applied to the word lines WL and the section in which the first common source line voltage (for example, the ground voltage Vss) is applied to the common source line CSL may overlap. In an exemplary embodiment of the inventive concept, the time point Tpre in which the pre-program voltage Vprepro is applied to the word lines WL may differ from the time point at which the ground voltage Vss is applied to the common source line CSL. For example, after the time point Tpre in which the pre-program voltage Vprepro is applied to the word lines WL, the ground voltage Vss may be applied to the common source line CSL. For example, at the time point Tpre at which the pre-program voltage Vprepro is applied to the word lines WL, the ground voltage Vss may be applied to the common source line CSL, and after a certain period of time, the second common source line voltage Vcs1 may be applied to the common source line CSL. For example, at the time point Tgf at which the ground selection line GSL floats, the second common source line voltage Vcs1 may be applied to the common source line CSL.

In an exemplary embodiment of the inventive concept, the section in which the ground voltage Vss is applied to the common source line CSL may be shorter than the section in which the pre-program voltage Vprepro is applied to the word lines WL. In an exemplary embodiment of the inventive concept, the section in which the ground voltage Vss is applied to the common source line CSL and the section in which the pass voltage Vpass is applied to the ground selection line GSL may overlap. For example, the pass voltage Vpass and the ground voltage Vss may be applied at the same time. In an exemplary embodiment of the inventive concept, however, the section in which the ground voltage Vss is applied to the common source line CSL may be longer than the section in which the pre-program voltage Vprepro is applied to word lines WL.

The inventive concept is not limited to the pre-program operations described in connection with FIGS. 4 and 8. The section in which the pre-program voltage Vprepro is applied to the word lines WL, the section in which the pass voltage Vpass is applied to the ground selection line GSL, and the section in which the ground voltage Vss is applied to the common source line CSL may overlap. To perform the pre-program operation, in the memory device 100, the time point Tpre at which the pre-program voltage Vprepro is applied to the word lines WL and the length of the section in which the pre-program voltage Vprepro is applied to the word lines WL may vary, the time point at which the pass voltage Vpass is applied to the ground selection line GSL and the length of the section in which the pass voltage Vpass is applied to the ground selection line GSL may vary, and the time point at which the ground voltage Vss is applied to the common source line CSL and the length of the section in which the ground voltage Vss is applied to the common source line CSL may vary.

Figure 9:
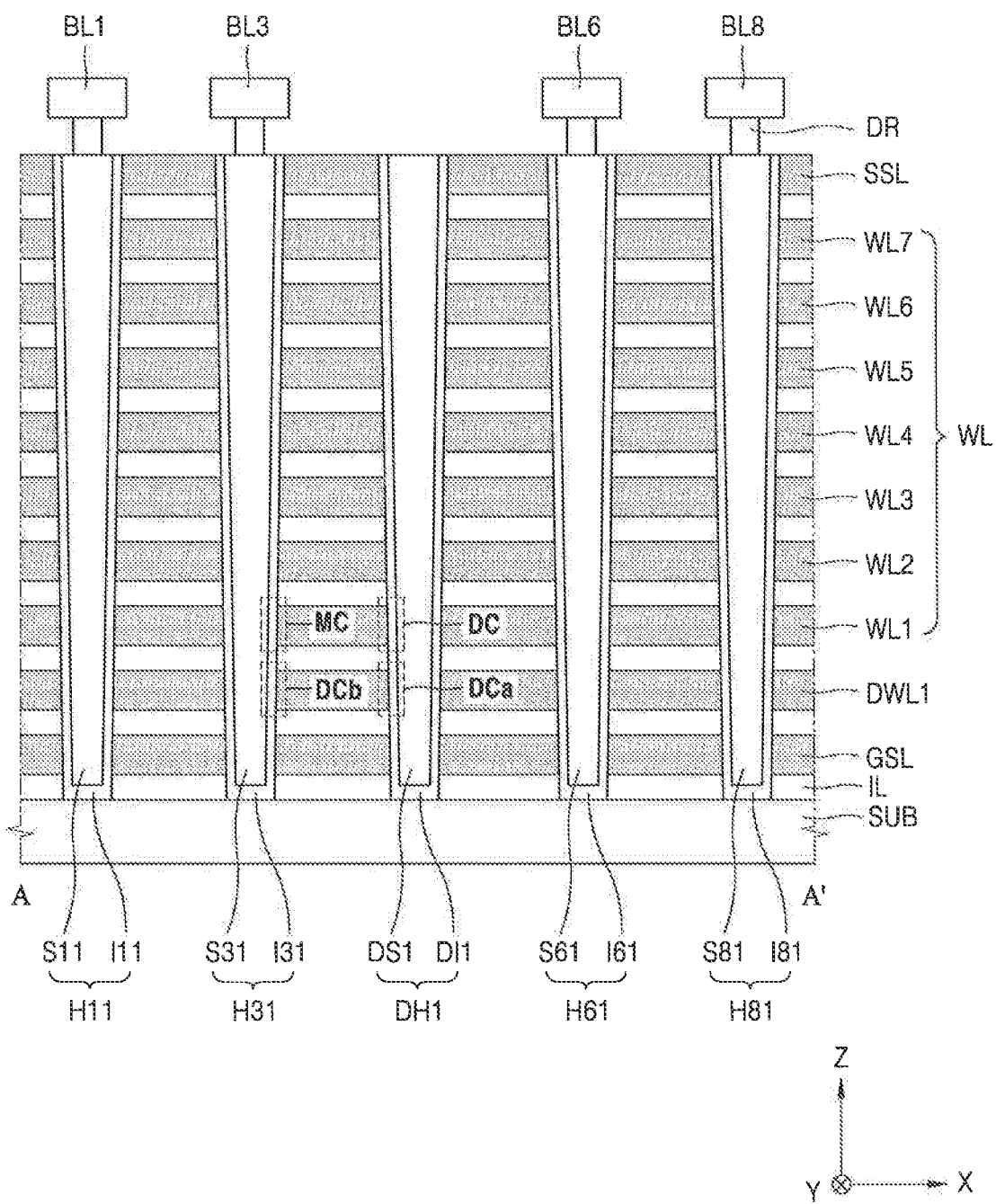
FIG. 9 is a cross-sectional view illustrating memory blocks included in a memory device according to an exemplary embodiment of the inventive concept.

FIG. 9 is a cross-sectional view illustrating memory blocks included in a memory device according to an exemplary embodiment of the inventive concept. FIG. 9 shows a cross-section taken along the line A-A' illustrated in FIG. 2A. In the embodiments described in connection with FIG. 9, the description provided in connection with FIG. 2B may be omitted.

Referring to FIG. 9, a ground selection line GSL, a dummy word line DWL1, a plurality of word lines WL1 to WL7, and a string selection line SSL may be arranged on a substrate SUB. In an exemplary embodiment of the inventive concept, the dummy word line DWL1 may be arranged adjacent to the ground selection line GSL. Although one dummy word line and seven word lines are illustrated in FIG. 9, the inventive concept is not limited thereto. The numbers of dummy word lines and word lines may vary. In an exemplary embodiment of the inventive concept, the dummy word line DWL1 may be arranged adjacent to the string selection line SSL.

In exemplary embodiments of the inventive concept, the dummy hole DH1 and each of the plurality of word lines WL1 to WL7 may form dummy cells DC. For example, the dummy hole DH1 and the word line WL1 may form a dummy cell DC. In exemplary embodiments of the inventive concept, the dummy hole DH1 and the dummy word line DWL1 may form a dummy cell DCa, and each of the main holes H11, H31, H61, and H81 and the dummy word line DWL1 may form a dummy cell DCb. The dummy cells DC, DCa, and DCb may be memory cells in which no data is written.

The main cells MC formed in each of the main holes H11, H31, H61, and H81, the dummy cell DCb, a ground selection transistor, and a string selection transistor may constitute one cell string per hole. The dummy cells DC and DCa formed in the dummy hole DH1, the ground selection transistor, and the string selection transistor may constitute one dummy string.

Since the dummy cells DC and DCa formed in the dummy hole DH1 are not connected to the bit lines BL1, BL3, BL6 and BL8, the dummy cells DC and DCa may not be programmed when a voltage is applied to the bit lines BL1, BL3, BL6, and BL8. Accordingly, in a memory device according to an exemplary embodiment of the inventive concept, the dummy cells DC and DCa formed in the dummy hole DH1 may be pre-programmed by applying a ground voltage to a common source line, a pass voltage to the ground selection line GSL, and a pre-program voltage to the word lines WL1 to WL7. In this case, a ground voltage may be applied to a substrate SUB.

In an exemplary embodiment of the inventive concept, a memory device may pre-program at least some of the dummy cells DC and DCa formed in the dummy hole DH1 by selectively applying a pre-program voltage to at least some of the dummy word line DWL1 and the word lines WL1 to WL7. The case in which the pre-program voltage is selectively applied to some of the dummy word line DWL1 and word lines WL1 to WL7 will be described in connection with FIGS. 10B and 10C.

Due to the applying of the ground voltage to the common source line, the pass voltage to the ground selection line GSL, and the pre-program voltage to the word lines WL1 to WL7, the main cells MC are also pre-programmed together with the dummy cells DC and DCa. In addition, the dummy cells DCb formed in the main holes H11, H31, H61, and H81, not the dummy hole DH1, may be pre-programmed.

FIGS. 10A through 10C are tables illustrating voltage conditions applied to word lines and dummy word lines when a memory device according to an exemplary embodiment of the inventive concept performs a pre-program operation.

Referring to FIGS. 9 and 10A, to perform a pre-program operation (for example, operation S10 of FIG. 3A), a memory device (for example, the memory device 100 of FIG. 1) may apply a pre-program voltage to the word lines WL and the dummy word line DWL1. In exemplary embodiments of the inventive concept, the memory device 100 may apply a pre-program voltage Vprepro to all word lines (for example, first to seventh word lines WL1 to WL7 and the dummy word line DWL1), connected to a dummy string on which a pre-program operation is to be performed. In other words, the pre-program operation may be performed on all main cells and dummy cells included in a memory block.

The memory device 100 may apply a pass voltage to a ground selection line GSL connected to the dummy string and a ground voltage to a common source line CSL, to perform the pre-program operation. The description provided in connection with FIGS. 4 to 8 may be applicable to the time point at which the pass voltage is applied to the ground selection line GSL and the time point at which the ground voltage is applied to the common source line CSL.

Referring to FIGS. 9 and 10B, the memory device 100 may apply the pre-program voltage to the dummy word line DWL1 which is selected to perform the pre-program operation, and the word line pass voltage Vwp to an unselected word line. In other words, the memory device 100 may selectively perform a pre-program operation. In exemplary embodiments of the inventive concept, the memory device 100 may perform a pre-program operation on the dummy cells DCa and DCb connected to the dummy word line DWL1 and may not perform the pre-program operation on the main cells MC. In this case, the level of the word line pass voltage Vwp may be lower than the level of the pre-program voltage Vprepro.

However, the memory device 100 according to an exemplary embodiment of the inventive concept may apply the pre-program voltage Vprepro to the word lines WL and apply the word line pass voltage Vwp to the dummy word line DWL1.

Referring to FIG. 10C, to perform the pre-program operation, the memory device 100 may apply a pre-program voltage Vprepro to the dummy word line DWL1 and some of the word lines WL, and may apply the word line pass voltage Vwp to the other word lines WL, the other word lines WL being the word lines WL that do not receive the pre-program voltage Vprepro.

In an exemplary embodiment of the inventive concept, the memory device 100 may selectively apply the pre-program voltage Vprepro to the dummy word line DWL1 and lines arranged close to the substrate SUB from among the word lines WL. In exemplary embodiments of the inventive concept, the memory device 100 may select the dummy word line DWL1 and the word lines WL1 and WL2 and apply the pre-program voltage Vprepro thereto. On the other hand, the word line pass voltage Vwp may be applied to the word lines WL3 to WL7 arranged farther from the substrate SUB than the word lines WL1 and WL2. In a memory device having a vertical memory cell structure, a memory cell positioned at a lower level adjacent to the substrate SUB may be more likely damaged. Thus, the memory device 100 may prevent memory cells from being damaged by performing a pre-program operation on memory cells positioned at a lower level adjacent to the substrate SUB.

Referring to FIGS. 10A to 10C, the pre-program voltage Vprepro is applied to the dummy word line DWL1. However, the inventive concept is not limited thereto. For example, the word line pass voltage Vwp may be applied to the dummy word line DWL1, and the pre-program voltage Vprepro may be applied to at least some of the word lines WL.

Figure 11A:
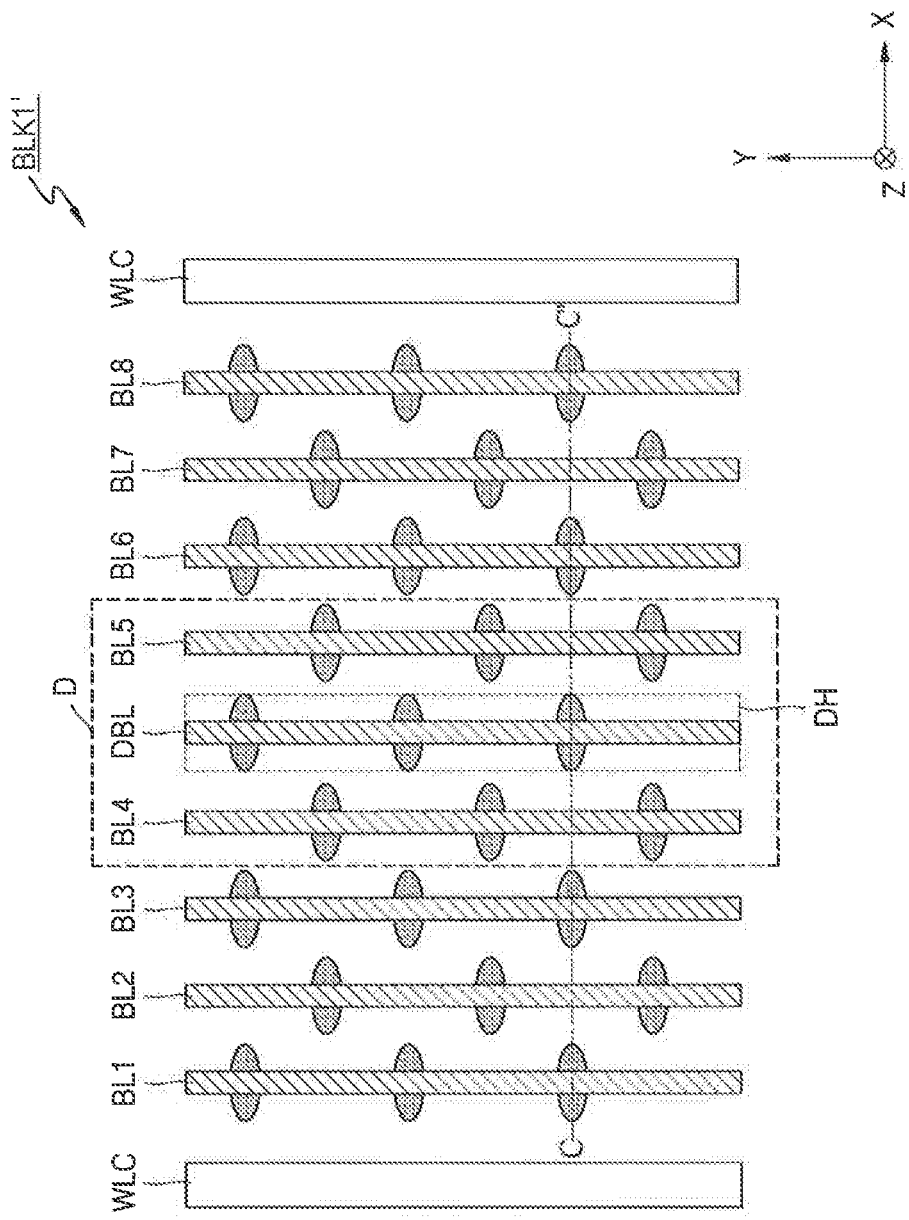
FIGS. 11A and 11B are views for explaining the first memory block illustrated in FIG. 1, according to an exemplary embodiment of the inventive concept.
Figure 11B:
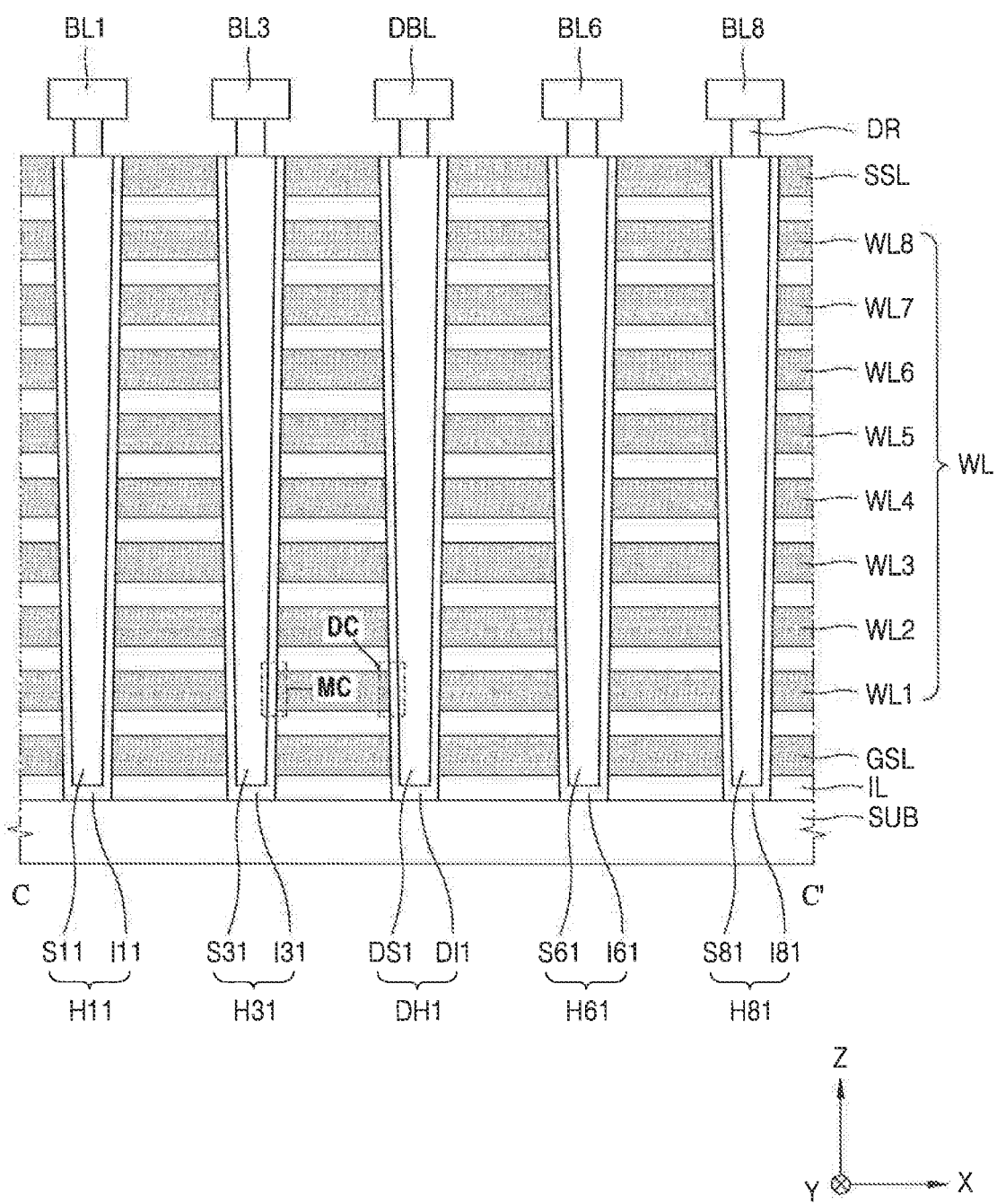

FIGS. 11A and 11B are views for explaining a first memory block illustrated in FIG. 1, according to an exemplary embodiment of the inventive concept. FIG. 11A is a top view of the first memory block illustrated in FIG. 1. FIG. 11B illustrates a cross-section taken along the line C-C' illustrated in FIG. 11A. In the embodiments described in connection with FIG. 11B, the corresponding descriptions provided in connection with FIG. 2B may be omitted. FIG. 11B illustrates region D of FIG. 11A in more detail.

Referring to FIG. 11A, a memory block BLK1' may include a plurality of vertical holes (for example, the main holes H11, H31, H61, and H81 and the dummy hole DH1 in FIG. 11B) arranged in the first direction X and the second direction Y between the word line cut regions WLC. The number of vertical holes included in the memory block BLK1' may vary.

The memory block BLK1' may be connected to bit lines BL1 to BL8 and a dummy bit line DBL extending in the second direction Y and spaced apart from each other in the first direction X. In an exemplary embodiment of the inventive concept, the main holes H11, H31, H61, and H81 may be respectively connected to corresponding bit lines BL1, BL3, BL6 and BL8, and the dummy hole DH may be connected to the dummy bit line DBL. In the embodiment shown in FIG. 11A, the memory block BLK1' includes eight bit lines including the bit lines BL1 to BL8 and one dummy bit line including the dummy bit line DBL. However, the inventive concept is not limited thereto, and the number of bit lines and the number of dummy bit lines vary.

Referring to FIG. 11B, each of the main holes H11, H31, H61, and H81 and each of the word lines WL1 to WL8 may form main cells MC, and the main holes H11, H31, H61, and H81 may be respectively connected to the bit lines BL1, BL3, BL6, and BL8. The main cells MC formed in each of the main holes H11, H31, H61, and H81, a ground selection transistor, and a string selection transistor may constitute one cell string per hole.

The dummy hole DH1 and each of the word lines WL1 to WL8 may form dummy cells DC, and the dummy hole DH1 may be connected to the dummy bit line DBL. The dummy cells DC formed in the dummy hole DH1, the ground selection transistor, and the string selection transistor may constitute one dummy string.

The memory device 100 may selectively pre-program memory cells included in a cell string or a dummy string by selectively applying a bit line program voltage to the bit lines BL1, BL3, BL6, and BL8 and the dummy bit line DBL. A case in which the pre-program operation is selectively performed on a cell string or a dummy string will be described in connection with FIGS. 12A and 12B.

FIGS. 12A and 12B are tables illustrating voltage conditions applied to bit lines and dummy bit lines when a memory device according to an exemplary embodiment of the inventive concept performs a pre-program operation. FIGS. 12A and 12B are views for explaining a pre-program operation selectively performed on at least some of a plurality of strings by controlling a bit line voltage.

Referring to FIGS. 11B and 12A, a memory device (for example, the memory device 100 of FIG. 1) may apply a bit line program voltage Vbpro to bit lines (BL, for example, BL1, BL3, BL6, and BL8) and the dummy bit line DBL during a pre-program operation (for example, operation S10 of FIG. 3A). Accordingly, a pre-program operation may be performed on cell strings connected to the bit lines BL and formed in the main holes H11, H31, H61, and H81, and a dummy string connected to the dummy bit line DBL and formed in the dummy hole DH1.

As described above, during the pre-program operation, the memory device 100 may apply a pre-program voltage Vprepro to at least some of the word lines WL, a pass voltage to the ground selection line GSL connected to a dummy string, and a ground voltage to the common source line CSL. The description provided in connection with FIGS. 4 to 8 may be applicable to the time point at which the pass voltage is applied to the ground selection line GSL and the time point at which the ground voltage is applied to the common source line CSL.

Referring to FIGS. 11B and 12B, the memory device 100 may selectively perform a pre-program operation on a dummy string (for example, a dummy string formed in the dummy hole DH1) from among a plurality of strings. The memory device 100 may not perform the pre-program operation on cell strings (for example, cell strings formed in the main holes H11, H31, H61, and H81). The memory device 100 may apply the bit line program voltage Vbpro to the dummy bit line DBL, and a program inhibition voltage Vbinh to the bit lines BL1, BL3, BL6, and BL8 connected to the cell strings. Once the program inhibition voltage Vbinh is applied to the bit lines BL1, BL3, BL6, and BL8, even when the pre-program voltage Vprepro is applied to a word line, main cells MC connected to the bit lines BL1, BL3, BL6, and BL8 may not be pre-programmed.

In this case, the level of the program inhibition voltage Vbinh may be greater than the level of the bit line program voltage Vbpro. For example, the bit line program voltage Vbpro may be a ground voltage and the program inhibition voltage Vbinh may be a power voltage.

In the embodiment described in connection with FIG. 12B, the pre-program operation is selectively performed on a dummy string. However, in exemplary embodiments of the inventive concept, the selective pre-program operation may be formed on at least some of the cell strings. For example, the memory device 100 may apply a bit line program voltage Vbpro to at least some of the cell strings.

The memory device 100 according to an exemplary embodiment of the inventive concept may selectively perform a pre-program operation on a dummy string from among a plurality of strings by applying the bit line program voltage Vbpro to the dummy bit line DBL. Since data may be written on the main cells MC included in cell strings, separate program operations may be performed. On the other hand, since the program operation in which data is written is not performed on the dummy cells DC included in the dummy string, damage to the dummy string may be prevented by performing a separate pre-program operation on the dummy string before or after the erasing operation.

Figure 13:
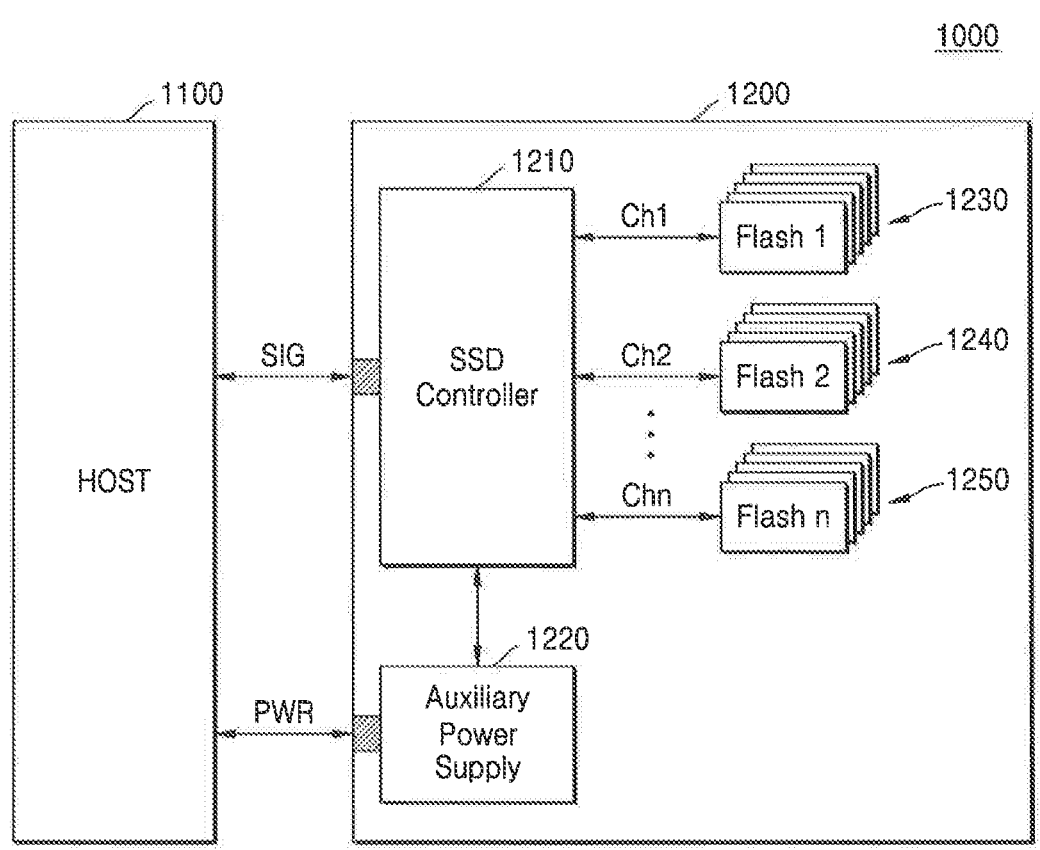
FIG. 13 is a block diagram illustrating a case in which a memory device according to exemplary embodiments of the inventive concept is applied to a solid state drive (SSD) system.

FIG. 13 is a block diagram illustrating a memory device according to exemplary embodiments of the inventive concept is applied to a solid state drive (SSD) system 1000.

Referring to FIG. 13, the SSD system 1000 may include a host 1100 and an SSD 1200. The SSD 1200 transmits and receives signals SIG to and from the host 1100 through a signal connector, and receives power PWR through a power connector. The SSD 1200 may include an SSD controller 1210, an auxiliary power supply 1220, and memory devices 1230, 1240 and 1250. The memory devices 1230, 1240 and 1250 may be flash memory devices. The memory devices 1230, 1240 and 1250 may be connected to the SSD controller 1210 through channels Ch1, Ch2, . . . Chn. The SSD 1200 may be implemented by the embodiments described above with reference to FIGS. 1 through 12B. Each of the memory devices 1230, 1240 and 1250 includes dummy cells included in a dummy string and may perform a pre-program operation on the dummy string before or after an erasing operation. Thus, it is possible to prevent the dummy string from being damaged due to repetitive erasing operations.

Exemplary embodiments of the inventive concept provide a vertical memory device that can prevent damage to a dummy string due to repeatedly performed erasing operations, and an operating method thereof.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. An operating method of, a memory device including a plurality of strings on a substrate, wherein the plurality of strings include a main string connected to a bit line and a dummy string spaced apart from the bit line, the operating method comprising:
pre-programming the dummy string; and
erasing the main string and the dummy string,
wherein the pre-programming includes:
applying a pre-program voltage to a word line connected to the dummy string;
applying a pass voltage to a ground selection line connected to a ground selection transistor of the dummy string; and
applying a common source line voltage to a common source line connected to the dummy string.

2. The operating method of claim 1, wherein the pre-program voltage, the pass voltage, and the common source line voltage overlap each other.

3. The operating method of claim 2, wherein a time in which the pass voltage is applied to the ground selection line is shorter than a time in which the pre-program voltage is applied to the word line.

4. The operating method of claim 2,. wherein a time in which the common source line voltage is applied to the common source line is shorter than a time in which the pre-program voltage is applied to the word line.

5. The operating method of claim 1, wherein the dummy string is connected to a dummy word line, and the pre-programming further comprises applying the pre-program voltage to the dummy word line.

6. The operating method of claim 1, wherein the dummy string is connected to a plurality of word lines, and the applying the pre-program voltage comprises: selectively applying the pre-program voltage to some of the plurality of word lines.

7. The operating method of claim 1, wherein the easing is performed after the pre-programming.

8. The operating method of claim 1, wherein the pre-programming is performed after the erasing.

9. A memory device, comprising:
a memory cell array comprising a plurality of strings each including memory cells respectively connected to word lines vertically stacked on a substrate; and
a control logic configured to sequentially perform a pre-program operation and an erasing operation on the plurality of strings, wherein
the plurality of strings include a main string to which a hit line is connected and a dummy string spaced apart from the bit line, and
the control logic, to perform the pre-program operation, applies a pre-program voltage to a first word line of the word lines connected to the dummy string, applies a pass voltage to a ground selection line connected to a ground selection transistor of the dummy string, and applies a common source line voltage to common source line connected to the dummy string.

10. The memory device of claim 9, wherein the pre-program voltage has a single pulse.

11. The memory device of claim 9, wherein the control logic applies the pre-program voltage to the first word line connected to the dummy string, and then, applies the pass voltage to the ground selection line.

12. The memory device of claim 9, wherein the control logic applies the pre-program voltage to the first word line connected to the dummy string, and then, applies the common source line voltage to the common, source line.

13. The memory device of claim 9, wherein the word lines comprise a dummy word line, and the control logic, to perform the pre-program operation, applies the pre-program voltage to the dummy word line and applies a word line pass voltage to the word lines other than the dummy word line, wherein a level of the word line pass voltage is lower than that of the pre-program voltage.

14. The memory device of claim 9, wherein the dummy string is connected to a dummy bit line, and the control logic applies, to perform the pre-program operation, a bit line program voltage to the dummy bit line and the bit line connected to the main string.

15. The memory device of claim 9, wherein the dummy string is connected to a dummy bit line, and the control logic, to perform a pre-program operation on the dummy string, applies a bit line program voltage to the dummy bit line and applies a program prohibition voltage to the bit line connected to the main string, wherein a level of the program prohibition voltage is higher than that of the bit line program voltage.

16. A memory device. comprising:
a memory cell array comprising a plurality of strings each including memory cells respectively connected to word lines vertically stacked on a substrate; and
a control logic configured to perform a pre-program operation on the plurality of strings, wherein the plurality of strings include a main string to which a bit line is connected and a dummy string spaced apart from the bit line, the control logic, during a pre-program operation, applies a pre-program voltage to the word lines, applies a pass voltage to a ground selection line connected to a ground selection transistor of the dummy string, and applies a first common source line voltage to a common source line connected to the dummy string, and a time in which the pre-program voltage is applied to the word lines, a time in which the pass voltage is applied to the ground selection line, and a time in which the first common source line voltage is applied to the common source line overlap one another.

17. The memory device of claim 16, wherein the control logic applies the pre-program voltage to the word lines connected to the dummy string, and then, applies the pass voltage to the ground selection line.

18. The memory device of claim 16, wherein the control logic applies the pre-program voltage to the word lines connected to the dummy string, and then, applies the first common source line voltage to the common source line.

19. The memory device of claim 16, wherein the control logic applies a-second common source line voltage to the common source line connected to the dummy string, wherein a level of the second common source line voltage is higher than that of the first common source line voltage, and the time in which the pre-program voltage is applied to the word lines and a time in which the second common source line voltage is applied to the common source line overlap each other.

20. The memory device of claim 19, wherein the first common source line voltage is a around voltage.

* * * * *